United States Patent
Yetter et al.

(10) Patent No.: US 7,082,655 B2
(45) Date of Patent: Aug. 1, 2006

(54) PROCESS FOR PLATING A PIEZOELECTRIC COMPOSITE

(75) Inventors: Kelley E. Yetter, Lewistown, PA (US); Leslie B. Nye, Dauphon, PA (US)

(73) Assignee: GE Inspection Technologies, LP, Wilmington, DE (US)

( * ) Notice: Subject to any disclaimer, the term of this patent is extended or adjusted under 35 U.S.C. 154(b) by 96 days.

(21) Appl. No.: 10/739,760

(22) Filed: Dec. 18, 2003

(65) Prior Publication Data

US 2005/0134142 A1 Jun. 23, 2005

(51) Int. Cl.
*H04R 17/00* (2006.01)
*B44C 1/22* (2006.01)
*C25D 5/02* (2006.01)
*H04R 31/00* (2006.01)

(52) U.S. Cl. .......... 29/25.35; 29/594; 29/842; 29/846; 29/841; 205/125; 205/162; 216/52; 216/57; 204/192.1; 310/340; 310/358

(58) Field of Classification Search ........... 29/25.35, 29/594, 842, 846, 841, 593, DIG. 16; 216/52, 216/57, 67, 72, 108; 205/122, 125, 162; 204/192.1, 192.17, 192.18; 310/340, 311, 310/358, 359
See application file for complete search history.

(56) References Cited

U.S. PATENT DOCUMENTS

| | | | |
|---|---|---|---|
| 4,450,374 A * | 5/1984 | Cho et al. | ............. 29/25.35 X |
| 4,756,808 A * | 7/1988 | Utsumi et al. | ....... 204/192.1 X |
| 5,340,510 A | 8/1994 | Bowen | |
| 5,539,965 A | 7/1996 | Safari et al. | |
| 5,755,909 A | 5/1998 | Gailus | |
| 5,818,149 A | 10/1998 | Safari et al. | |
| 5,844,349 A | 12/1998 | Oakley et al. | |
| 5,950,291 A | 9/1999 | Gentilman et al. | |
| 6,037,707 A | 3/2000 | Gailus et al. | |
| 6,088,894 A | 7/2000 | Oakley et al. | |

(Continued)

FOREIGN PATENT DOCUMENTS

JP 63-260211 * 10/1988 ................ 29/25.35

OTHER PUBLICATIONS

Baborowski et al, "PZT Coated Membrane Structures for Micromachined Ultrasonic Transducers", Proceedings of the International Symposium on the Application of Ferroelectrics, 2002, ISAF 2002, pp. 483-486, May 2002.*

*Primary Examiner*—A. Dexter Tugbang
(74) *Attorney, Agent, or Firm*—McNees Wallace & Nurick LLC

(57) ABSTRACT

A transducer having a ceramic element in which the ceramic is elevated above a polymer and a method of manufacturing the transducer. The transducer comprises a piezo-composite element comprising a ceramic element embedded in epoxy. In an array, the ceramic elements may be in the form of posts. The plurality of ceramic elements is slightly elevated above the polymer and in staggered arrangement with the polymer. The element is manufactured by first grinding the face of the composite and removing damaged ceramic by acid etching the ceramic. The epoxy is removed by plasma etching so that the ceramic is above the epoxy. The composite is sputter plated so that a maximum temperature that could damage the plating is not exceeded. The ceramic is then poled so that a maximum temperature that could damage the plating is not exceeded. Contacts are then attached to the plating adjacent the ceramic.

27 Claims, 3 Drawing Sheets

U.S. PATENT DOCUMENTS

| | | |
|---|---|---|
| 6,140,743 A | 10/2000 | Kishima et al. |
| 6,200,491 B1 * | 3/2001 | Zesch et al. .............. 216/52 X |
| 6,252,337 B1 | 6/2001 | Tanaka |
| 6,278,224 B1 | 8/2001 | Sawada et al. |
| 6,297,580 B1 | 10/2001 | Takayama et al. |
| 6,307,306 B1 | 10/2001 | Bast et al. |
| 6,390,985 B1 | 5/2002 | Mamayek |
| 6,411,018 B1 | 6/2002 | Heinz |
| 6,467,140 B1 | 10/2002 | Gururaja |
| 6,538,363 B1 | 3/2003 | Nagahara et al. |
| 6,541,898 B1 | 4/2003 | Kitajima et al. |
| 6,571,444 B1 | 6/2003 | Mauchamp et al. |
| 6,573,639 B1 | 6/2003 | Heinz et al. |
| 6,574,842 B1 | 6/2003 | Brenner et al. |
| 2002/0036447 A1 | 3/2002 | Nagahara et al. |
| 2002/0038990 A1 | 4/2002 | Homer et al. |
| 2002/0074902 A1 | 6/2002 | Kitajima et al. |
| 2002/0093394 A1 | 7/2002 | Tikka et al. |
| 2002/0124369 A1 | 9/2002 | Gauchet |
| 2003/0029010 A1 | 2/2003 | Aime |
| 2003/0042995 A1 | 3/2003 | Ella |
| 2003/0051323 A1 | 3/2003 | Gururaja |
| 2003/0127949 A1 | 7/2003 | Nagahara et al. |

* cited by examiner

PROCESS FOR PLATING A PIEZOELECTRIC COMPOSITE

FIELD OF THE INVENTION

The present invention is directed to a piezoelectric composite to which plating is applied and a method for applying such a plating to provide improved adhesion and reliability, and specifically to a ceramic piezoelectric composite ultrasonic transducer having an array of ceramic posts and a method for manufacturing such transducers.

BACKGROUND OF THE INVENTION

Ultrasonic transducers incorporate one or more piezoelectric vibrators which are electrically connected to a pulsing-receiving unit in the form of an ultrasonic test unit. The piezoelectric transducer converts an electrical pulse from the pulsing unit and converts the electrical signal to a mechanical vibration which is transmitted through a material such as a metal to which it is coupled. The piezoelectric material has the ability to receive a mechanical vibration from the material to which it is coupled and convert it to an electrical pulse which is sent to the receiving unit. By tracking the time difference between the transmission of the electrical pulse and the receipt of the electrical signal and measuring the amplitude of the received wave, various characteristics of the material can be determined. The mechanical pulse is generally in the frequency range of about 0.5 MHz to about 25 MHz, so it is referred to as an ultrasonic wave from which the equipment derives its name. Thus, for example ultrasonic testing can be used to determine material thickness or the presence and size of imperfections within a material.

Ultrasonic transducers can be used in pairs of send only and receive only units. However, frequently the transducers are transceivers that both send and receive the pulses. The transducer may be a single element or a single transducer may be comprised of a plurality of ceramic elements. This invention is broadly directed to the transducer or probe that is comprised of a ceramic element or elements and improved methods of manufacturing such transducers. Such transducers that utilize the composite ceramic include single element transducers, dual element transducers and arrayed (phased array) transducers.

These transducers currently are produced by providing a single-piece ceramic material, such as a lead-zirconate-titanate (PZT) ceramic. This ceramic is processed to produce a plurality of spaced columns/posts or planes of preselected side projecting from a solid piece of the ceramic which is unaffected by the processing. This unaffected solid piece of ceramic is referred to as the ceramic backbone. This invention is more narrowly directed to improvements in processing of the ceramic element that is used in an ultrasonic probe, the probe including not only the ceramic, but also the matching layers, the backing, the case and the connectors.

After the plurality of spaced columns or spaced planes, also referred to as a diced ceramic, has been formed, the spacing between the columns or planes is filled with an epoxy polymer. Sufficient epoxy polymer is applied to form a continuous layer of epoxy overlying the diced ceramic and opposite the ceramic backbone.

The ceramic backbone is then removed by grinding. To assure complete removal of the ceramic backbone, the ceramic removal operation extends below the backbone and slightly into the diced ceramic, removing a small portion of each post or plane. This is not significant, as it is important to maintain a flat surface with a smooth surface finish. The surface standard for parallelism is 0.0002" after grinding, and the surface finish is about 35,000 Angstrom units or smoother, typically between about 15,000 to about 35,000 Angstrom units. After the backbone has been removed, the workpiece is flipped over and the epoxy polymer is removed by grinding. Again, some small portion of each post may be removed, but it is important to maintain a flat surface with a smooth surface finish. It is not important whether the epoxy polymer or the ceramic backbone is removed first, although the processing is somewhat easier if the ceramic backbone is removed first. At this point in the processing, the workpiece comprises a plurality of ceramic posts embedded in an epoxy polymer. Both sides of the workpiece are then finish ground. After finish grinding, the ceramic posts are depressed typically from about 15,000 to about 30,000 Angstroms below the epoxy polymer. The depression of the posts can be reduced to 2000 Angstroms below the surface of the epoxy by an optional polishing step. A cross-section of a prior art multi-arrayed transducer after an optional polishing operation is shown in FIG. 1 with a layer of plating 32 applied over its surface, depicting the ceramic posts 12 lying below the surface of the epoxy 24.

The ceramic is cleaned in an ultrasonic cleaner to remove any damaged ceramic. The power setting of the cleaners are adjustable, and the power setting is adjusted to a level at which plating on posts is not removed is not removed from the posts during cleaning. After cleaning, the ceramic is rinsed followed by plasma cleaning, the ceramic workpiece is sputter plated, and the plating is tested for adhesion. The ceramic workpiece is then dice-deactivated and poled to activate the ceramic.

While this process can produce an effective transducer, there are problems associated with such transducers. These problems are associated with ceramic posts or planes being depressed below the surface of the epoxy. The sputter plating process provides a very thin plating over the surface. Total plating thickness is about 15000 Angstroms, which is applied by a line of sight process. Because the ceramic posts are depressed below the surface of the epoxy polymer, it is possible that the sputtering process may not provide a uniform coating of the surface, particularly along the perpendicular surfaces extending between the parallel planes of epoxy polymer and ceramic material. In addition, since the sputter plating operation is performed at temperatures of about 120° C. (about 250° F.), the epoxy is free to expand unrestrained above the ceramic posts or planes. Even though this expansion is small, because of the thinness of the plating deposited by the sputter plating process, it can be sufficient to damage the thin plating extending in the vertical direction along the epoxy polymer between the ceramic posts and the horizontal surface of the epoxy, causing poor performance of the ceramic, such as low capacitance. After sputtering, the ceramic is dice-deactivated and poled to activate the ceramic. The temperatures for poling can be in the range as high as about 100–110° C. After poling, contacts are soldered to the plating.

Another problem with this configuration is that the depressed ceramic is difficult to solder. As a result, the solder heat is borne by the epoxy during the soldering process, causing it to expand, and further increasing the possibility that the thin plating may fracture, thereby causing bad solder connections.

A transducer with a plurality of elements formed from a ceramic, which elements are not depressed below the polymer, would overcome many of the difficulties associated with the prior art transducers described above, but such a transducer and a method for fabricating such a transducer is heretofore unknown to the art.

SUMMARY OF THE INVENTION

The present invention provides a transducer having a ceramic element in which the ceramic is elevated above a polymer. This favorable configuration of the transducer is produced as a result of the method of manufacturing the transducer. The transducer may comprise a piezo-composite element comprising a ceramic element embedded in epoxy, such as is found in a single element transducer. The transducer may comprise a piezo-composite element having a plurality of ceramic elements embedded in epoxy and, the ceramic elements separated from one another by a polymer. The plurality of piezo-ceramic elements may be as simple as a dual element transducer in which two ceramic elements are separated by a non-conductive polymer, a four element array of ceramic elements or it may comprise an array having a larger number of piezo-ceramic elements, each element similarly separated. For example a 50×50 array, having about 2500 elements, with each element being rectangular and having an edge of about 0.002 inches can readily be manufactured. In an array, the ceramic elements may be in the form of posts, each post being an emitter acting as a plurality of wave point sources when excited, or the ceramic elements may be in the form of strips, forming a planar interface, each strip being an emitter of a planar wave when excited. The plurality of ceramic elements is slightly elevated above the polymer and in staggered arrangement with the polymer. As a result, the face of the composite comprising the ceramic and epoxy does not comprise a truly planar arrangement. The face includes a conductive layer such as a noble metal applied over it. Each of the ceramic elements forming emitters is individually connected to the drive signal and to ground in parallel by contacts soldered to the conductive layer. By exciting the individual ceramic members simultaneously, acoustic performance is significantly improved as the present invention provides improved reliability in the electrical connection between the ceramic element(s) and the plating. In this configuration, a transducer incorporating the ceramic made in accordance with the present invention also provides a lower acoustic impedence and better power transfer, particularly to rough surfaces. When in post configuration, a transducer incorporating a ceramic made in accordance with the present invention will also provide improved resolution.

The transducer of the present invention is formed by first providing a single-piece ceramic material having a first side and a second side. This ceramic is processed from the first side to produce a plurality of spaced columns/posts or planes of preselected size projecting from the second side, which is a solid piece of the ceramic forming a backbone unaffected by the processing. The spacing between the columns or planes is then filled with a nonconductive material such as a polymer. Sufficient polymer is applied to form a continuous layer overlying the diced ceramic and opposite the ceramic backbone. The ceramic backbone is then removed by grinding, the workpiece is flipped over, and the polymer is removed by grinding. A small portion of each post may be removed, as long as a flat surface with a smooth surface finish is provided. The workpiece comprising a plurality of ceramic posts embedded in a polymer is then finish ground. At this point the ceramic posts are depressed typically from about 15,000 to about 30,000 Angstroms below the polymer. The preparation techniques are virtually identical to the prior art techniques.

Now, the workpiece is first etched in an acid solution. The acid solution is selected to preferentially attack the ceramic. After the workpiece has been etched for a sufficient time, the workpiece is then removed from the acid and cleaned with deionized water solution for a period of time sufficient to neutralize the acid. The workpiece is then dried with a non-reactive gas and the part is then plasma etched. The plasma etching etches the polymer so that it is depressed below the surface of the ceramic elements, exposing the ceramic posts. After plasma etching, the surface of the transducer is sputter-plated at temperatures below about 75° C. The ceramic elements are then dice de-activated, and then poled at temperatures below about 60° C. After poling, the contacts can be soldered to the metallized transducer elements in the conventional manner.

A significant advantage of the present invention is that each of the plurality of ceramic elements forming the transducer of the present invention extends above the polymer matrix by as much as about 25,000 Angstroms, which provides a different surface than provided by the prior art transducers. If too much of the ceramic is exposed, it becomes susceptible to cracking.

The above-mentioned advantage overcomes a series of problems associated with the prior art transducers, thereby producing additional advantages. Because the ceramic elements extend above the polymer matrix, the ceramic will constrain the expansion of the polymer. However because the sputter plating is performed at a much lower temperature than previous sputter plating operations, the expansion will not as severe, leading to less expansion and less stress applied to the thin, fragile plating.

In a similar fashion, the dice de-activation and poling are at temperatures well below the prior art temperatures, so that these operations provide less expansion to the transducer materials, again resulting in less stress applied to the thin, fragile plating.

Another advantage that results from the ceramic elements extending above the polymer matrix is that the heat resulting from the soldering of the contacts to the elements will result in the ceramic elements being subject to the heat of soldering. This is desirable, as ceramic materials can more readily react to heat than the polymer matrix. Ceramic materials typically have a low coefficient of thermal expansion, so this heat will have less of an effect on the fragile plating, which will experience lower stresses with lower expansion.

Another advantage of the process of the present invention is that the acoustic layers are more readily adhered to ceramic posts projecting above the polymer. Acoustic layers are applied over the face of the ceramic. When the ceramic posts in an array are depressed below the surface of the polymer, it is difficult for the material adhering the acoustic layers to the face of the transducer to wet the top of the posts. Proper wetting of the posts is required in order to obtain efficient coupling between the very small posts that generate the ultrasound and the acoustic layer(s). Failure to achieve a good contact between the posts and the acoustic layer can result in a transducer having low gain. Such failures typically occur when the adhesive used to adhere an acoustic layer to the face of the ceramic failed to contact the top of the ceramic posts. Additionally, by providing a ceramic face having the ceramic posts projecting slightly above the polymer, it is possible to provide an electrical connection to the ceramic post by wedge-bonding rather than by soldering. Wedge bonding is not possible when the polymer projects above the ceramic posts, as the polymer typically is not sufficiently hard or strong to support the wedge bonding application.

Another advantage of the present invention is that the acid etching of the ceramic material in an ultrasonic bath after the grinding operation attacks the grain boundaries of the ceramic posts. The acid is formulated to accomplish this, and combined with the ultrasonic vibrations, assists in removing damage areas from the ceramic posts, thereby providing a more structurally sound surface on which to adhere the subsequently applied sputter plating.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
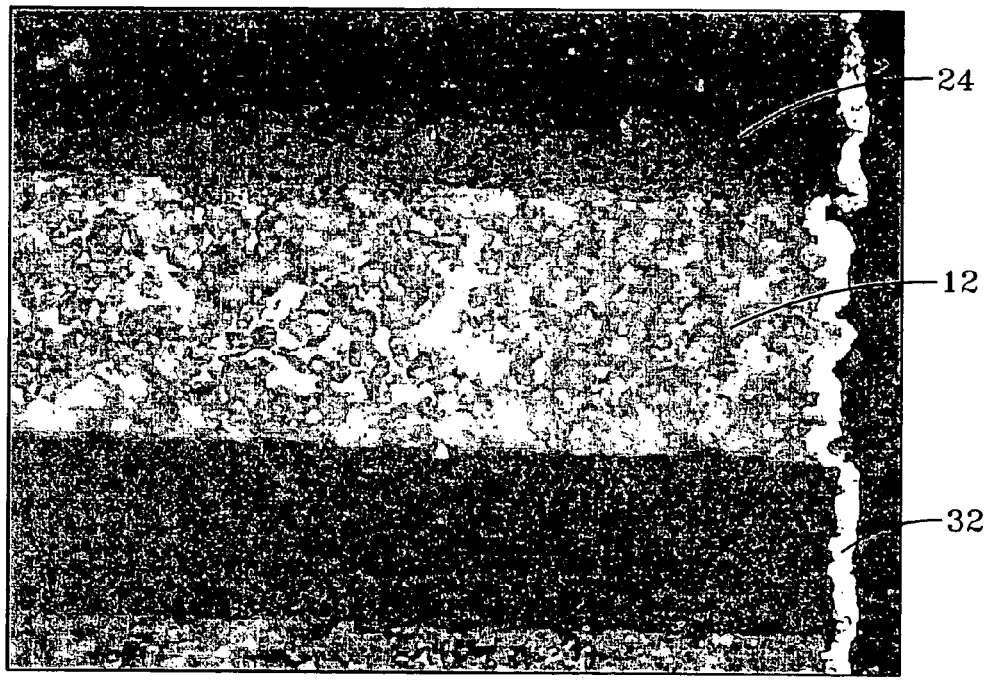
FIG. 1 is a cross-sectional view of a prior art multi-arrayed transducer with a plating applied over its surface, depicting the ceramic posts lying below the surface of the epoxy.
Figure 2:
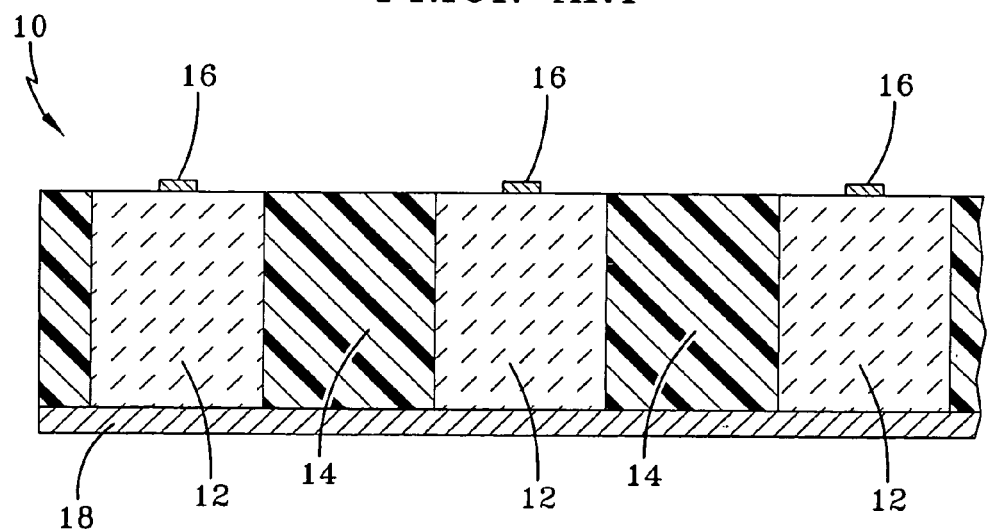
FIG. 2 is a cross-sectional view of a multi-arrayed transducer.

FIG. 2 depicts a multi-arrayed transducer 10 that incorporates the piezo-electric composite of the present invention. The transducer is comprised of a plurality of piezo-composite ceramic posts 12. Each ceramic post 12 is spaced from an adjacent ceramic post 12 by a nonconductive material 14, such as a polymer. In a preferred embodiment, the polymer is an epoxy. The piezo-ceramic composite posts are characterized by their ability to vibrate when exposed to an electrical excitation, thereby generating a mechanical or sound wave, hereinafter referred to as an acoustic wave, and to generate an electrical pulse when excited by an incident acoustic wave. A preferred ceramic material is lead-zirconate-titanate (PZT), although other equivalent materials such as polycrystalline relaxor materials (PZN-PT materials) and biased electrorestrictor materials (PMN-PT ferroelastic relaxor materials) may be used as is known in the art. Each ceramic post 12 or element includes an electrical connection 16 to allow the elements to be connected in parallel with a device that includes a power source. The device typically is an ultrasonic test unit that, in addition to including a power source, includes an ability to condition signals received by the test unit and to allow the signals to be displayed. The ultrasonic test units are well known in the art and, while used in connection with the present invention, are not part of the present invention. The transducer 10 typically includes a facing material 18 that facilitates coupling the multi-arrayed transducer to a test piece.

Figure 3:
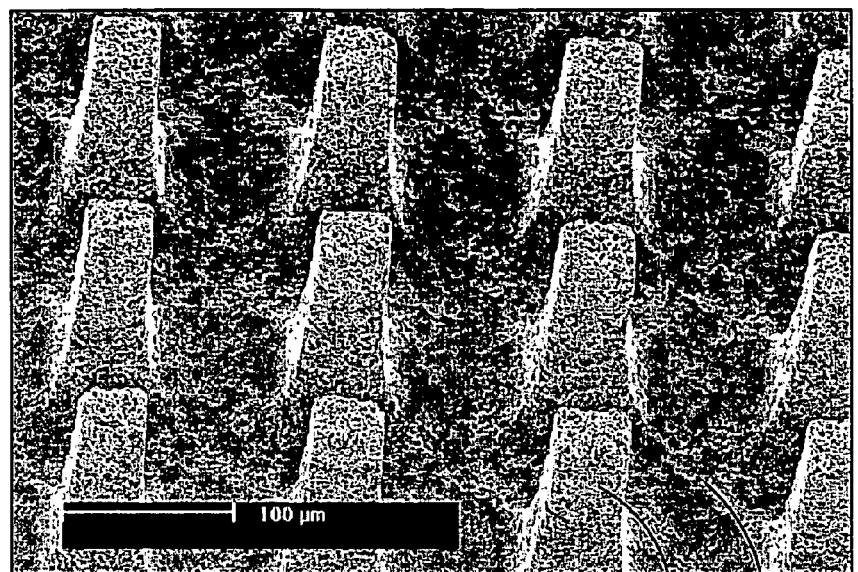
FIG. 3 is a perspective view of ceramic posts after dicing.

The piezo-composite ceramic posts 12 of the present invention are initially provided as a block of ceramic material of preselected size. The preselected size is chosen on the basis of the transducer size. The ceramic block is typically mechanically cut into a plurality of posts, yielding a two dimensional array of posts. The methods of performing such cuts are well-known and any acceptable method for cutting the block may be used. It is preferred that the ceramic block be cut using a dicing saw. The diced ceramic block 20 having the ceramic posts projecting upward form a ceramic backbone 22 is shown in FIG. 3, the spacing between the posts being the kerfs remaining after the block has been diced.

Figure 4:
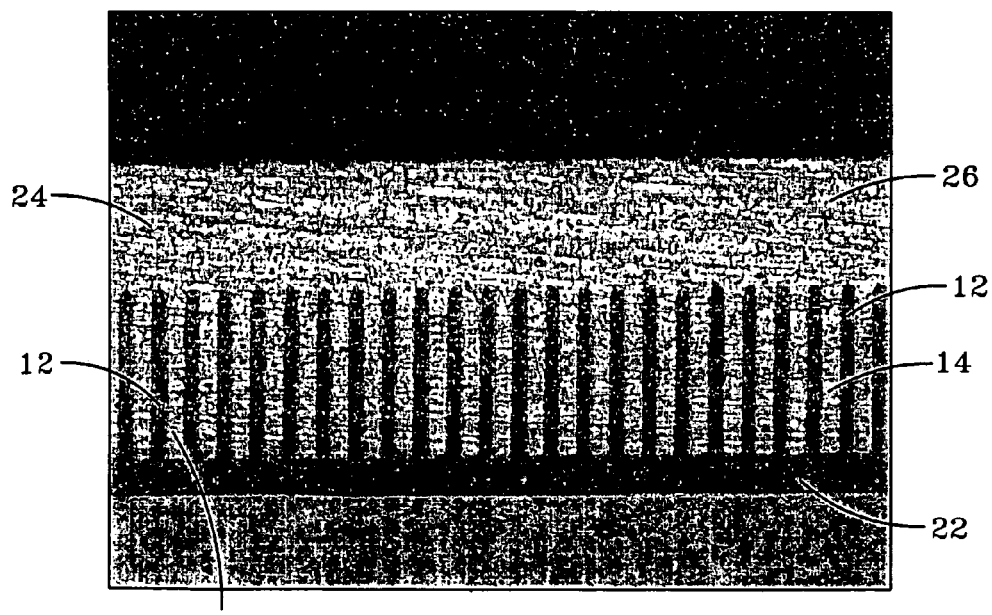
FIG. 4 is a cross-sectional view of a ceramic block filled with a non-conductive polymer.

The kerfs of the diced ceramic block 20 are then filled with a nonconductive material 14, as depicted in FIG. 4, which is a cross-section of a block 20 filled with an epoxy 24 to provide structural support, particularly in the transverse direction under a shear load, for the thin and brittle ceramic posts 12. As can be seen in FIG. 4, the epoxy 24 forms an epoxy backbone 26 that overlies the ceramic posts 12, and fills the interstitial areas 28 between the posts.

Figure 5:
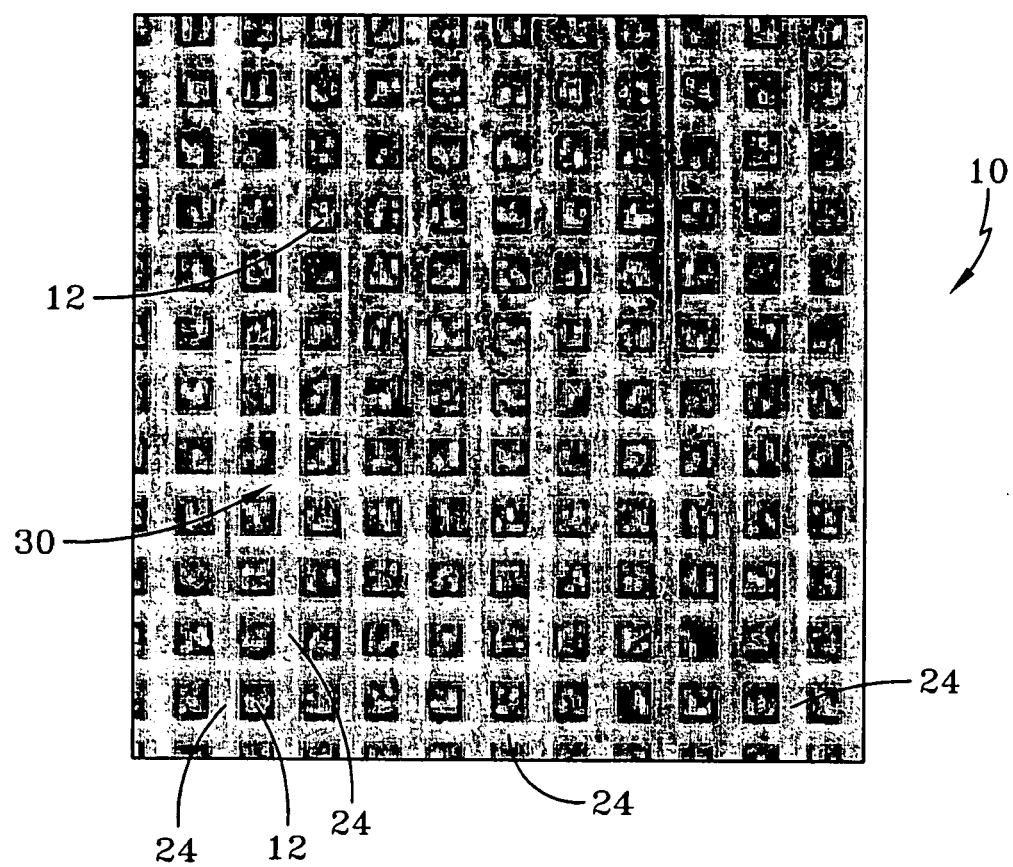
FIG. 5 is a front view of the transducer after finish grinding operations have been completed.

Both the ceramic backbone 22 and the epoxy backbone 26 must be removed. The ceramic backbone 22 and the epoxy backbone 26 typically initially are rough ground to remove the bulk of the material. It is desirable to rough grind both the ceramic backbone 22 and the epoxy backbone as close as possible to the ceramic posts without exposing the ceramic posts. However, sometimes the grinding may extend slightly below the backbones 22, 26. The next mechanical operation is a finish grinding operation to produce a smooth, uniform surface. Each side of the epoxy-filled ceramic is subjected to the grinding operations. The finish grinding operation can be accomplished by any acceptable methods that produce a smooth uniform surface. Linear grinding, lapping and back grinding all are acceptable finish grinding steps. FIG. 5 depicts the face of the finish ground transducer 30 after finish grinding. FIG. 5 depicts the ceramic posts 12 surrounded by the epoxy 24, the ceramic posts 12 being depressed about 15,000–30,000 Angstrom units below the surface of the epoxy 24.

In order to place the ceramic posts 12 in the same plane as the epoxy 24, the finish ground workpiece is placed in an acid solution. The acid solution is selected to etch the piezo-ceramic composite posts as a pre-plating step. While the acid selected will depend upon the specific ceramic material used, a solution of $HBF_4$ and $HNO_3$ has been effective in etching PZT ceramic. More specifically, a preferred 2000 milliliter solution having about 200 milliliters of $HNO_3$ (50% concentrated acid by volume) and about 4 milliliters of $HBF_4$ (50% concentrated acid by volume) was mixed by adding the concentrated acids to about 1796 milliliters of water to yield a solution of about 0.1% $HBF_4$ by volume and about 5% $HNO_3$ by volume. This solution is exemplary of the solution utilized in the best mode for practicing the invention. It will be understood that other concentrations of the disclosed acids and other acids may be used, as long as the acid etches the grain boundaries of the ceramic grains. The workpiece is vibrated in this acid solution in an ultrasonic cleaner for a time sufficient to etch the ceramic posts. The preferred time for etching is about 30 seconds, although the etching time will depend on the concentration of the acid and the acids used. The time must be sufficient to etch the grain boundaries of the posts to facilitate removal of ceramic material which may have been damaged during the grinding operations. All ultrasonic cleaners described herein operate at 80 Khz, although the ultrasonic cleaners may be operated at different frequencies, so long as the required process step is successfully accomplished.

After etching, the workpiece is removed from the cleaner and the acid is neutralized. The preferred method for neutralizing the acid is a multi-step wash with deionized water. The workpiece is first rinsed with deionized water for about two minutes. Then, the workpiece is then placed into a second ultrasonic cleaner having deionized water for a preselected period of time, about 3–4 minutes, after which it is spray dried, with a non-reactive gas such as nitrogen, although an inert gas may be used. In the preferred embodiment, dry filtered air is used to dry the workpiece.

Figure 6:
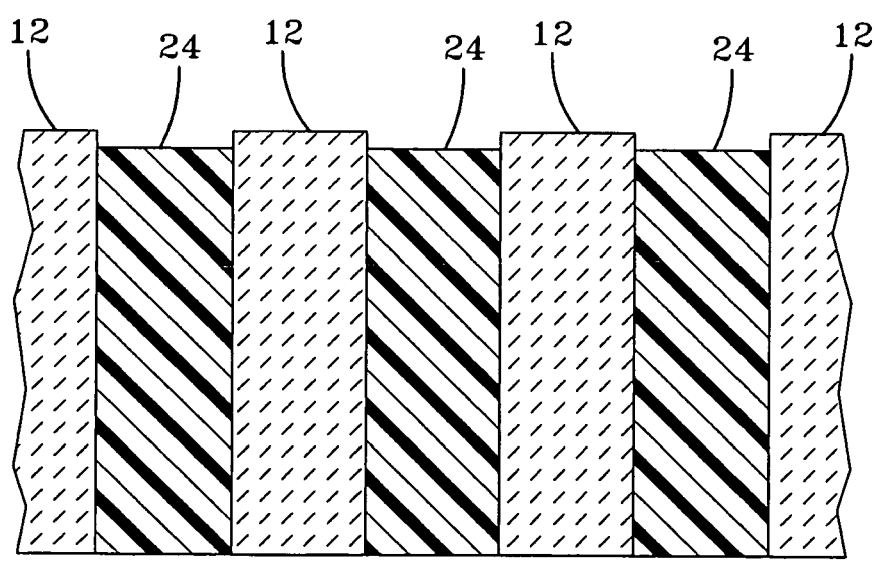
FIG. 6 is a cross-sectional view of the workpiece of the present invention after plasma etching, depicting the ceramic posts lying above the surface of the epoxy.

Next, the epoxy 24 is preferentially removed so that the ceramic posts 12 do not remain depressed below the epoxy 24. The epoxy 12 is preferentially removed from the surface of the workpiece by plasma etching. Plasma etching of the epoxy 24 is accomplished with a high energy gas stream that removes the epoxy 24 from the surface of the workpiece, but does not adversely affect the ceramic posts 12. Oxygen is the preferred plasma etching gas. During the plasma etching operation, the plasma stream may reach a temperature in the range of about 250° F.–290° F. The plasma etching was accomplished at a rate of about 1500 Angstroms per minute and continued for a sufficient length to time, to produce ceramic posts 12 having the required elevation over the epoxy. The amount of time required for the plasma etch will vary, depending upon the amount of epoxy on the workpiece after either finish grinding or polishing, a longer time being required for a greater amount of epoxy. Since etching the surface to achieve a plane including both the epoxy 24 and the ceramic posts 12 of a few atomic layers in thickness is extremely difficult to accomplish, the preferred embodiment etches the epoxy 24 sufficiently so that the ceramic posts 12 are slightly above the adjacent epoxy 24, but no more than about 25000 Angstroms above the epoxy. This preferred configuration with the ceramic posts projecting above the epoxy is shown in FIG. 6. Both sides of the workpiece are plasma etched in this fashion.

Immediately after the plasma etching process is completed, the workpiece is placed into the sputtering chamber, and the opposed faces of the etched workpiece are sputter plated at a maximum temperature of about 75° C. (167° F.) and more preferably at a maximum temperature of about 62° C. (144° C.). The selected temperature is related to the expansion of the polymer. If the temperature is too high, the expansion of the polymer is too great and the sputtered plating is adversely affected. For epoxy, the temperature is about 10° C. to about 15° C. above the $t_g$ (glass transition temperature) of the epoxy. As is clear, the maximum sputtering temperature will vary from polymer composition to polymer composition, as the expansion/contraction of the polymer is the determining factor affecting the plating. The combination of the lower sputtering temperature of the atoms, the etching of the ceramic posts, and the ceramic posts 12 being above or about at the same level as the epoxy provides better adhesion of the plating to the surface of the workpiece. Because of the differences in thermal expansion between the ceramic posts, the epoxy and the metallic materials comprising the plating, avoiding the elevated temperatures of the prior art processing and maintaining the plating process at 75° C. and below reduces thermally induced stresses in the very thin plating as the workpiece cools, thereby providing a workpiece having a higher reliability, since the probability of failure due to plating failure is reduced. The plating is preferably applied as a trilayer of titanium, palladium and silver. The titanium is applied as a first layer to a thickness of about 300 to about 600 Angstrom units under a vacuum of about 1.5 mTorr. The palladium layer is applied over the titanium to a thickness of about 2000–3000 Angstroms under a vacuum of about 4 mTorr. The silver layer is applied over the palladium layer to a thickness of about 9,000–12,000 Angstroms under a vacuum of about 4 mTorr. In order to maintain the temperature at 60° C. or below, it is necessary to sputter at a current of about 500 milliamps, which is carefully controlled. The initial voltage was 408 volts, but the potential in not carefully controlled and will vary depending upon the target material. However, to avoid exceeding the maximum temperature, it is necessary to sputter the silver in a plurality of stages. At the above-noted amperage and voltage, four separate plating stages of 10 minutes with an intervening period of time for cooling is required.

After sputter plating, a plated side of the workpiece is poled to activate the piezo-ceramic material at a temperature of up to about 60° C. (140° F.). Preferably the plating temperature is maintained at a temperature below about 60° C. Poling entails inducing a high voltage field across the ceramic. The ceramic is immersed in a dielectric fluid to prevent arcing. The present invention accomplishes poling at a temperature below about 60° C., which is a lower temperature than the prior art poling temperature of 110° C. recommended by the manufacturer of PZT. The present invention also accomplishes poling at a higher voltage/unit thickness, up to about 170 volts (V) per 0.001", which is also higher than the voltage of p to a bout 150 volts per 0.001" recommended by the manufacturer of PZT. The poling provides an electrical potential to each of the individual ceramic posts. The advantage of the lower poling temperature is that the epoxy expansion is reduced so as not to adversely affect the plating. The poling temperature that may be used will vary from polymer to polymer being dependent on the thermal expansion of the polymer and the temperature required to accomplish poling. The posts are electrically connected in parallel, so that a short electrical pulse from the power supply will cause each of them to vibrate simultaneously and generate an acoustic pulse. A reflected pulse causes the ceramic posts to vibrate and generate an electrical signal. The slight differences in timing receipt and amplitude of the reflected pulse from the different ceramic posts and the corresponding electrical signal can be resolved and conditioned by the ultrasonic equipment to which the transducer is attached to provide meaningful information to a trained technician.

Subsequent finishing operations may be performed on the workpiece in order to produce a finished transducer, such as providing acoustic layers to the transducer face. However, these processes are well known to the art, and this invention does not make further contribution to these well-known practices.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for manufacturing a ceramic element for use in an ultrasonic transducer comprising the steps of:

provinding a ceramic material of preselected size having a first side and an opposed second side, the ceramic material further characterized as a piezo-elastic material;

encapsulating the ceramic material in a non-conductive polymer to form a composite;

processing the first side of the composite to expose the ceramic material, the ceramic material in the first side being positioned in the composite below the polymer in the first side;

processing the second side of the composite to expose the ceramic material, the ceramic material in the second side being positioned in the composite below the polymer in the second side;

acid etching the first side of the composite, the acid selected to attack the ceramic material;

acid etching the second side of the composite, the acid selected to attack the ceramic material; then plasma etching the polymer on the first side of the composite for a time sufficient to remove a portion of the polymer so that the ceramic material extends above the polymer on the first side of the composite;

plasma etching the polymer on the second side of the composite for a time sufficient to remove a portion of the polymer so that the ceramic material extends above the polymer on the second side of the composite; then plating the first side of the composite with a conductive material at a first preselected temperature sufficiently low such that the difference in expansion between the ceramic material and the polymer does not damage the applied plating;

plating the second side of the composite with a conductive material at the first preselected temperature sufficiently low such that the difference in expansion between the ceramic and the polymer does not damage the applied plating; then deactivating the ceramic material and poling the ceramic material at a second preselected temperature sufficiently low that the difference in expansion between the ceramic material and the polymer does not damage the applied plating; then attaching contacts to one side of the plated composite; and applying acoustic layers to the composite to form the transducer.

2. The method of claim 1 wherein the step of plating the first side includes sputtering onto the first side of the composite at a first preselected temperature below about 75° C.

3. The method of claim 1 wherein the step of deactivating and poling includes poling the ceramic material at a temperature that does not exceed about 60°.

4. The method of claim 1 wherein the step of providing the ceramic material includes providing the ceramic material selected from the group consisting of PZT, PZN-PT and PMN-PT.

5. The method of claim 1 wherein the step of encapsulating the ceramic material in the non-conductive polymer includes encapsulating the ceramic material in an epoxy.

6. The method of claim 1 wherein the step of processing the first side of the composite and processing the second side of the composite includes rough grinding the first side of the composite and grinding the second side of the composite.

7. The method of claim 6 wherein the step of processing the first side of the composite and processing the second side of the composite further includes the additional step of finish grinding after the rough grinding.

8. The method of claim 7 wherein the additional step of finish grinding includes a process selected from the group consisting of linear grinding, lapping and rough grinding.

9. The method of claim 7 wherein the ceramic material is depressed between about 15,000–30,000 Angstroms below the polymer after finish grinding.

10. The method of claim 4 wherein the acid is selected to preferentially etch the grain boundaries of the ceramic material.

11. The method of claim 10 wherein the step of acid etching the first and second sides of the composite further includes vibrating the ceramic material in the acid for a sufficient time to remove that portion of the ceramic material damaged by the grinding step.

12. The method of claim 4 wherein the step of providing a ceramic material includes providing PZT.

13. The method of claim 12 wherein the step of acid etching further includes acid etching the ceramic material on the first and second sides of the composites in a solution of $HB_4$ and $HNO_3$.

14. The method of claim 1 wherein the step of plasma etching the polymer on the first and second sides of the composite in a high energy gas stream.

15. The method of claim 14 wherein the high energy gas stream includes a high energy oxygen stream.

16. The method of claim 1 wherein the step of applying the contacts to one side of the composite includes soldering the contacts to the plating on one side of the composite.

17. The method of claim 1 wherein the step of applying the contacts to one side of the composite includes wedge bonding the contacts to the plating on one side of the ceramic material.

18. The method of claim 1 further including an additional step, after providing the ceramic material and before encapsulating the ceramic material, of dicing the ceramic material to form a plurality of ceramic posts.

19. The method of claim 18 wherein the step of encapsulating the ceramic material further includes encapsulating space between the ceramic posts after dicing with the polymer.

20. The method of claim 1 wherein the step of plasma etching the polymer on the first and second sides of the composite extends the ceramic material up to about 25,000 Angstroms above the polymer.

21. The method of claim 2 wherein the step of sputtering further includes sputtering a first layer of titanium over the first side and the second side of the composite, followed by a layer of palladium over the titanium, followed by a layer of silver over the palladium.

22. The method of claim 21 wherein the layer of titanium has a thickness of about 300–600 Angstroms, the layer of palladium has a thickness of about 2,000–3,000 Angstroms and the layer of silver has a thickness of about 9,000–12,000 Angstroms.

23. The method of claim 22 wherein the silver is applied in a plurality of passes while maintaining the current level constant, so that the preselected temperature is not exceeded.

24. A method for manufacturing a ceramic element for use in an ultrasonic transducer comprising the steps of:

providing a ceramic material of preselected size having a first side and an opposed second side, the ceramic material further characterized as a piezo-elastic material;

dicing the ceramic material to form a plurality of ceramic posts;

encapsulating the ceramic material in a non-conductive polymer so that the polymer fills at least a region between adjacent posts to form a composite;

grinding the first side of the composite to expose the ceramic material, the ceramic material in the first side being positioned in the composite below the polymer in the first side;

grinding the second side of the composite to expose the ceramic material, the ceramic material in the second side being positioned in the composite below the polymer in the second side;

acid etching the first side of the composite, the acid selected to attack the ceramic material;

acid etching the second side of the composite, the acid selected to attack the ceramic material; then plasma etching the polymer on the first side of the composite with a gas for a time sufficient to remove a portion of the polymer so that the ceramic posts extend above the polymer up to about 25,000 Angstroms on the first side of the composite;

plasma etching the polymer on the second side of the composite with a gas for a time sufficient to remove a portion of the polymer so that the ceramic posts extend above the polymer up to about 25,000 Angstroms on the second side of the composite; then plating the first side of the composite with a conductive material at a first temperature no higher than about 75° C. and at a constant current such that the difference in expansion between the ceramic material and the polymer does not damage the applied plating;

plating the second side of the composite with a conductive material at a first temperature no higher than about 75° C. and at a constant current such that the difference in expansion between the ceramic material and the polymer does not damage the applied plating; then deactivating the ceramic material and poling the ceramic material at a second temperature below about 60° C. so that the difference in expansion between the ceramic material and the polymer does not damage the applied plating; then attaching a plurality of contacts to one side of the plated composite, one contact adjacent to each ceramic post; and applying acoustic layers to the composite to form the transducer.

25. The method of claim 24 wherein the step of providing the ceramic material includes providing PZT.

26. The method of claim 25 wherein the steps of acid etching the ceramic material on the first and second sides of the composite are performed in a solution of $HBF_4$ and 5% $HNO_3$.

27. The method of claim 24 wherein the steps of plasma etching the polymer on the first and second sides of the composite are accomplished by using a stream of oxygen as the plasma gas.

* * * * *

UNITED STATES PATENT AND TRADEMARK OFFICE
CERTIFICATE OF CORRECTION

| | | |
|---|---|---|
| PATENT NO. | : 7,082,655 B2 | Page 1 of 1 |
| APPLICATION NO. | : 10/739760 | |
| DATED | : August 1, 2006 | |
| INVENTOR(S) | : Yetter et al. | |

It is certified that error appears in the above-identified patent and that said Letters Patent is hereby corrected as shown below:

Column 10, line 18: "$HB_4$" should be --$HBF_4$--

Signed and Sealed this

Ninth Day of January, 2007

JON W. DUDAS
*Director of the United States Patent and Trademark Office*